United States Patent [19]

Steger

[11] Patent Number: 5,268,200
[45] Date of Patent: Dec. 7, 1993

[54] METHOD OF FORMING PLASMA ETCH APPARATUS WITH CONDUCTIVE COATING ON INNER METAL SURFACES OF CHAMBER TO PROVIDE PROTECTION FROM CHEMICAL CORROSION

[75] Inventor: Robert J. Steger, San Jose, Calif.

[73] Assignee: Applied Materials, Inc., Santa Clara, Calif.

[21] Appl. No.: 782,839

[22] Filed: Oct. 24, 1991

Related U.S. Application Data

[62] Division of Ser. No. 526,220, May 21, 1990, Pat. No. 5,085,727.

[51] Int. Cl.$^5$ ............................................ H01L 21/00
[52] U.S. Cl. ................... 427/249; 427/255.1; 427/255.2; 156/345; 156/643
[58] Field of Search ............... 156/345, 643, 646; 427/38, 39, 249, 255.1, 255.2

[56] References Cited

U.S. PATENT DOCUMENTS

| 4,419,201 | 12/1983 | Levinstein et al. | 204/192 E |
| 4,427,516 | 1/1984 | Levinstein et al. | 156/345 X |
| 4,491,496 | 1/1985 | Laporte et al. | 156/646 X |
| 4,526,644 | 7/1985 | Fujiyama et al. | 156/345 |
| 4,816,113 | 3/1989 | Yamazaki | 156/646 X |

FOREIGN PATENT DOCUMENTS

| 56-087667 | 7/1981 | Japan . |
| 63-277751 | 5/1987 | Japan . |

Primary Examiner—Thi Dang
Attorney, Agent, or Firm—John P. Taylor

[57] ABSTRACT

An improved plasma etching apparatus is disclosed which includes an etch chamber having inner metal surfaces with a conductive coating formed thereon which is capable of protecting such inner metal surfaces from chemical attack by reactant gases such as halogen-containing gases used in said chamber during plasma etching processes. In a preferred embodiment, at least about 0.2 micrometers of a carbon coating is formed on the inner metal surfaces of the etch chamber by a plasma-assisted CVD process using a gaseous source of carbon and either hydrogen or nitrogen or both.

4 Claims, 3 Drawing Sheets

FORMING A CONDUCTIVE COATING ON THE INNER METAL SURFACES OF A PLASMA ETCH CHAMBER TO PROTECT THE METAL FROM CHEMICAL ATTACK BY REACTIVE GASES BY THE STEPS OF:

↓

MAINTAINING THE CHAMBER AT A TEMPERATURE OF FROM ABOUT 20° C TO ABOUT 500° C AND AT A PRESSURE OF FROM ABOUT 1 MILLITORR TO ABOUT 500 MILLITORR

↓

FLOWING INTO THE CHAMBER, AT A RATE OF FROM ABOUT 10 TO ABOUT 1000 SCCM, A GASEOUS MIXTURE CONTAINING AT LEAST ONE GAS CAPABLE OF FORMING THE CONDUCTIVE COATING

↓

MAINTAINING A PLASMA IN THE CHAMBER DURING THE FLOW OF GASES AT A POWER LEVEL OF FROM ABOUT 200 TO ABOUT 1000 WATTS

Figure 4

METHOD OF FORMING PLASMA ETCH APPARATUS WITH CONDUCTIVE COATING ON INNER METAL SURFACES OF CHAMBER TO PROVIDE PROTECTION FROM CHEMICAL CORROSION

This is a divisional of copending application(s) Ser. No. 07/526,220 filed on May 21, 1990, now U.S. Pat. No. 5,085,727.

BACKGROUND OF THE INVENTION

1. Field of the Invention

This invention relates to the plasma etch chamber of a plasma etching apparatus provided with a protective conductive coating formed on the inner metal surfaces of the chamber and a method of forming such a protective coating.

2. Description of the Related Art

The plasma etch chamber of apparatus used for plasma etching of materials such an semiconductor wafers is usually constructed using metal such as aluminum for the etch chamber walls. When plasma etching is used with certain types of gases, such as halogen gases, e.g., chlorine, corrosion of the metal walls can occur. This has necessitated the formation of a protective coating on the metal surfaces facing the chamber, i.e., the inner surfaces of the chamber walls.

When aluminum constitutes the metal used for the chamber walls, conventionally the aluminum is anodized and the resulting aluminum oxide coating provides the necessary chemical protection against corrosive attack of the aluminum by the halogen gases.

However, while anodizing the inner aluminum surfaces of the plasma etch chamber at least partially solves the problem of chemical attach by the reactive gases used in the etch chamber, such anodizing, in turn, creates other problems. Being an insulator, the presence of the anodized coating on the etch chamber walls results in poor plasma electrical contact to the grounded metal chamber surface which leads to arcing, high plasma potential, and poor grounding, leading, in turn, to problems of process repeatability and process control. Furthermore, such electrical problems can, in turn, lead to further chemical corrosion problems since the plasma, in seeking out ground, often concentrates on any cracks in the insulative coating which can lead to chemical corrosion concentrated at such locations.

It would, therefore, be desirable to provide protection means against chemical attack to the inner metal surfaces of the etch chamber of a plasma etching apparatus without interfering with the electrical functions of the plasma etching apparatus. Furthermore, such protection means must not in any way degrade any integrated circuit devices formed or to be formed on the semiconductor wafer being etched in the etch chamber.

SUMMARY OF THE INVENTION

It is, therefore, an object of the invention to provide a plasma etching apparatus wherein the inner walls of the plasma etch chamber are protected against chemical attack by the reactant gases present in the chamber without interfering with the electrical functions of the plasma etch chamber.

It is another object of the invention to provide a plasma etching apparatus wherein the inner walls of the plasma etch chamber are protected against chemical attack by the reactant gases present in the chamber by applying a conductive coating to the inner metal surfaces of the chamber capable of providing protection against such chemical attack without interfering with the electrical functions of the plasma etch chamber.

It is yet another object of the invention to provide a plasma etching apparatus wherein the inner walls of the plasma etch chamber are protected against chemical attack by the reactant gases present in the chamber by applying a conductive coating to the inner metal surfaces of the chamber capable of providing protection against such chemical attack without interfering with the electrical functions of the plasma etch chamber and without in any way degrading any integrated circuit devices formed or to be formed on the semiconductor wafer being etched in the etch chamber.

It is still another object of the invention to provide a plasma etching apparatus wherein the inner walls of the plasma etch chamber are protected against chemical attack by the reactant gases present in the chamber by applying a carbon-based conductive coating to the inner metal surfaces of the chamber capable of providing protection against such chemical attack without interfering with the electrical functions of the plasma etch chamber.

It is a further object of the invention to provide a method for forming such an electrically conductive protective coating on the inner metal surfaces of the plasma etch chamber.

These and other objects of the invention will apparent from the following description and accompanying drawings.

BRIEF DESCRIPTION OF THE DRAWINGS

FIG. 4 is a flow sheet illustrating the process of forming the chemically protective conductive coating on the inner metal surfaces of the plasma etch chamber.

DETAILED DESCRIPTION OF THE INVENTION

Figure 1:
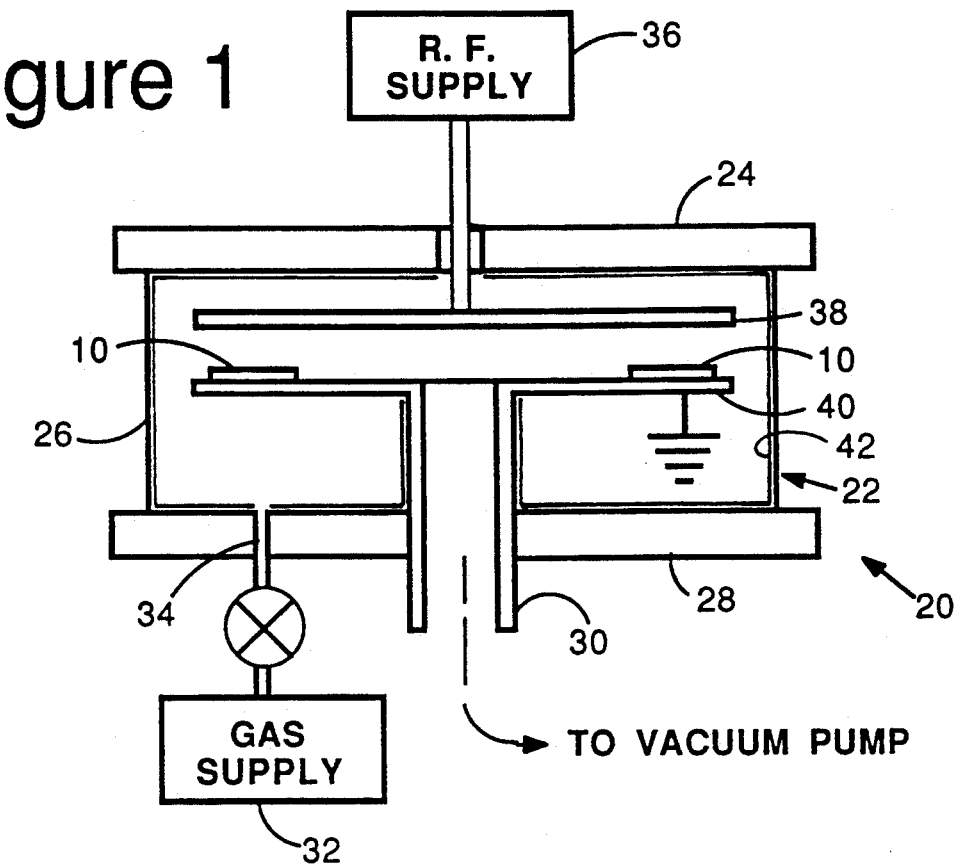
FIG. 1 is a vertical cross-sectional view of one type of plasma etching apparatus, showing the protective conductive coating applied to the inner metal surfaces of the plasma etch chamber to protect these surfaces from chemical attack.
Figure 2:
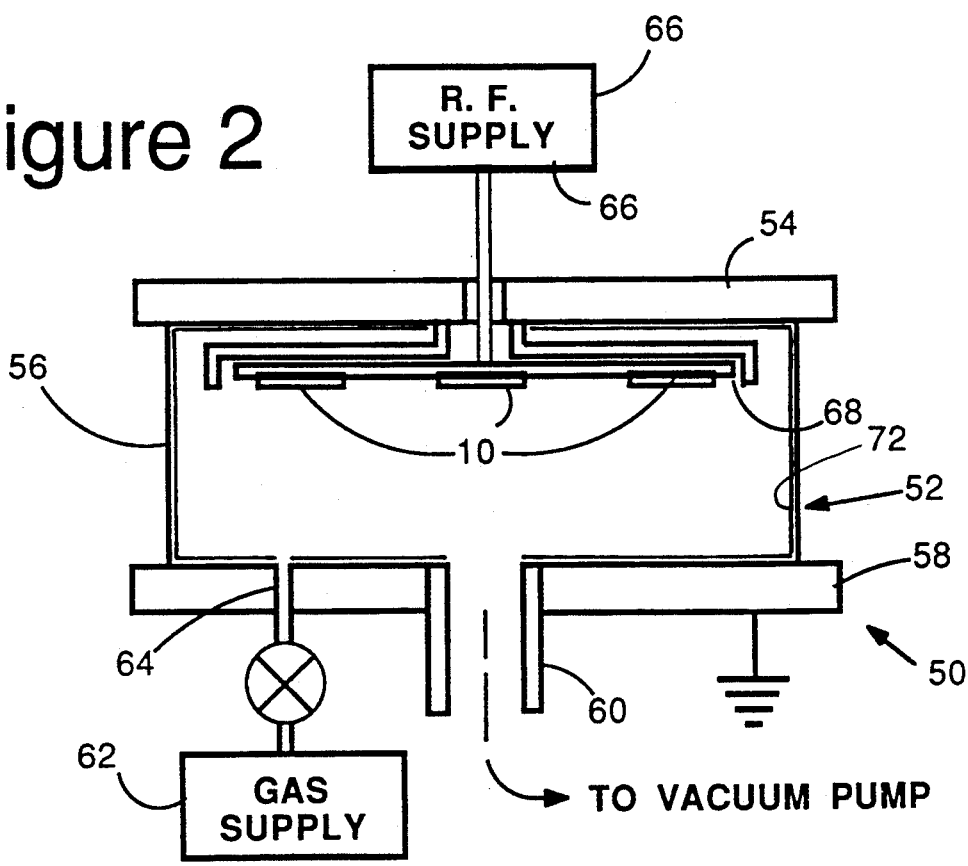
FIG. 2 is a vertical cross-sectional view of another type of plasma etching apparatus, showing the protective conductive coating applied to the inner metal surfaces of the plasma etch chamber to protect these surfaces from chemical attack.
Figure 3:
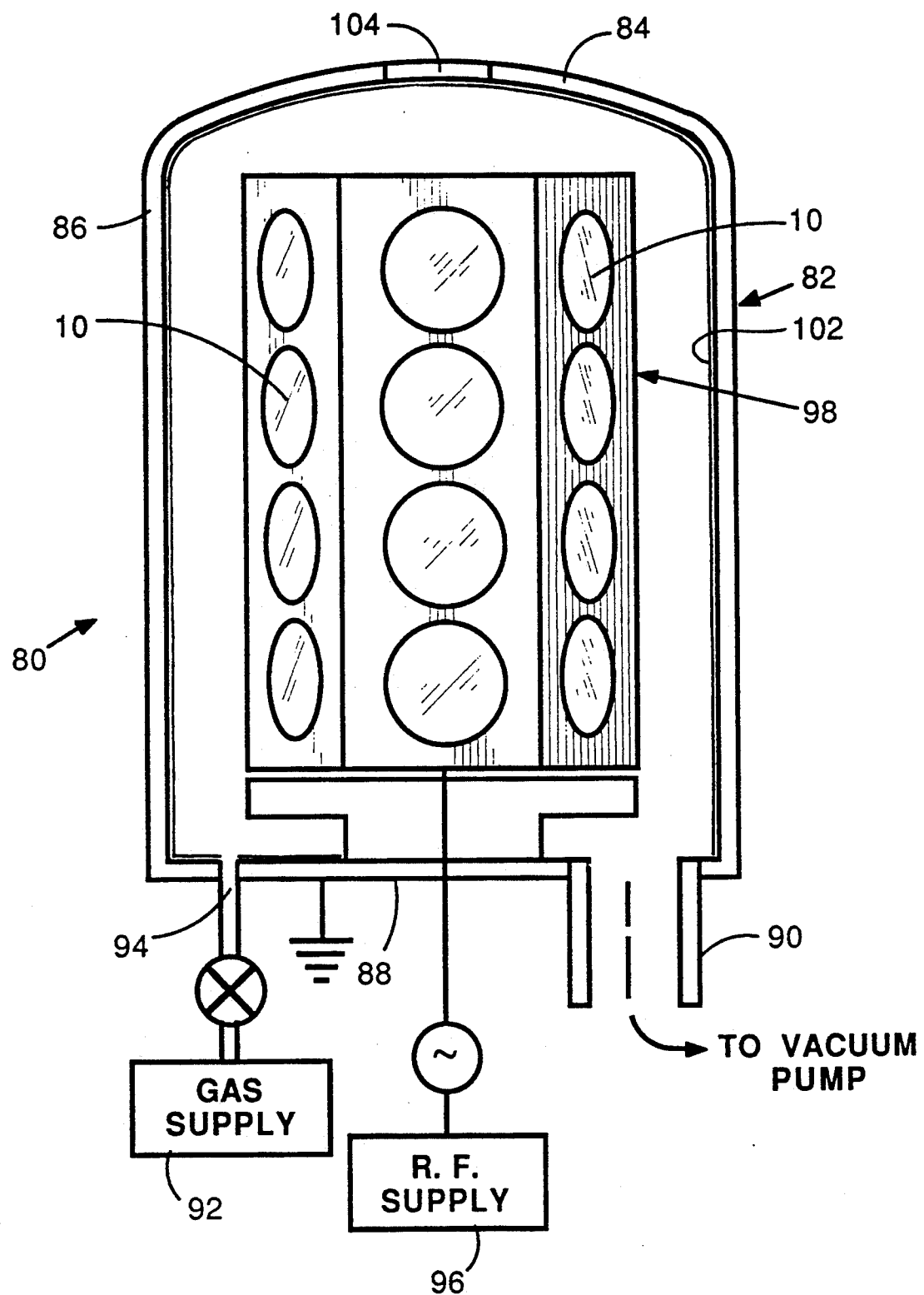
FIG. 3 is a vertical cross-sectional view of yet another type of plasma etching apparatus, showing the protective conductive coating applied to the inner metal surfaces of the plasma etch chamber to protect these surfaces from chemical attack.

FIGS. 1-3 illustrate several types of plasma etching systems having plasma etch chambers with metal walls into which reactant gases are admitted. In each instance, the exposed inner metal surfaces of the etch chamber have been coated with a protective layer of an electrically conductive material capable of preventing or inhibiting chemical attack of the metal surfaces by the reactant gases employed in the plasma etching process.

FIG. 1 shows a parallel plate plasma etching apparatus 20 which includes a closed metal reaction chamber 22 comprising a top plate 24, sidewalls 26 and a baseplate 28 with a connection 30 to a vacuum pump (not shown) for partial evacuation of chamber 22, and a reactant gas supply source 32 which supplies the reactant gas to chamber 22 through a valve-controlled conduit 34. Plasma etching apparatus 20 further includes an RF power supply 36 which supplies RF energy to a cathode plate 38 which is mounted in chamber 22 parallel to a grounded anode plate 40. Wafers 10 are mounted on grounded anode plate 40 facing cathode 38. The connection to the vacuum pump is configured to draw the reactant gases into the region between anode 40 and cathode 38 for confining the reactant gas plasma formed by the RF energy supplied to cathode 38.

In accordance with the invention, a conductive coating 42 is formed on the inner surfaces of metal chamber 22, i.e., the inner surfaces of top plate 24, sidewalls 26, and baseplate 28, as well as the under surface of anode plate 40, which is capable of protecting such surfaces from chemical attack by the reactant gases flowing within chamber 22 during the plasma etching of wafers 10. By use of the term "conductive coating" is meant a coating having a conductivity of not less than 5000 mhos/cm.

Conductive coating 10 has a minimum coating thickness of at least about 0.2 micrometers (2000 Angstroms) to provide sufficient protection for the metal chamber surfaces against chemical attack by the reactant gases in the chamber during the plasma etching process. The protective coating thickness may range up to as high as about 1 micrometer (10,000 Angstroms). Thicker coatings may be utilized, but are not necessary to provide the desired protection and, if too thick, could interfere with the process, as well as possibly providing an undesirable source of particles within the chamber.

Conductive coating 10 may comprise any conductive coating material capable of adhering to the metal surfaces when applied thereto which will provide protection for the underlying metal surface against chemical attack by the reactant gases in the chamber. Therefore, the conductive coating must be a relatively chemically inert material, i.e., not subject to chemical attack by the reactant gases.

The protective conductive coating must also be able to withstand other reaction conditions present in the chamber during the plasma etch process, including the reaction temperature and vacuum conditions used during typical plasma etch processes, which may respectively range from about 10° C. to about 70° C., and from about 5 milliTorr to about 1500 milliTorr during such typical plasma etch processes.

In accordance with a preferred embodiment of the invention, it has been found that a carbon coating, formed by plasma-assisted chemical vapor deposition (plasma-CVD), provides the desired chemical protection to the exposed inner metal surfaces of the etching chamber while still providing a conductive surface so that the plasma etch conditions in the chamber, i.e., the electrical properties, will not be changed by the presence of the protective carbon coating on the metal chamber walls.

By using a plasma-assisted CVD process and because the coating is conductive, the coating may be formed on the metal surfaces of the etch chamber in situ, that is, without the need for any disassembling of the etch apparatus. Furthermore, should the conductive coating need repair or renewal at a subsequent time, a further layer may be easily applied over the existing layer using the same deposition techniques.

Examples of other conductive coating materials which also may be applied to the inner metal surfaces to provide the desired chemical protection without interfering with the plasma etch processing include titanium nitride (TiN), indium stannate (InSnO), silicon carbide (SiC), titanium carbide (TiC), and tantalum carbide (TaC).

When the protective conductive coating material comprises carbon, the gases used in the plasma-assisted CVD formation of the protective coating may include a mixture of either nitrogen or hydrogen (or both) with a gaseous source of carbon. The gaseous source of carbon may comprise any gaseous combination of carbon and hydrogen, including any hydrocarbon in gaseous form such as such as, for example, $CH_4$, $C_2H_6$, $C_3H_8$, $CH_{10}$, as well as unsaturated gaseous hydrocarbons, e.g., ethene, ethyne, propene, propyne, butene, butyne, etc. Gaseous forms of compounds containing either carbon and nitrogen or a combination of carbon, hydrogen, and nitrogen may also be used such as cyanogen ($C_2N_2$) or hydrogen cyanide (HCN).

By way of illustration, and not of limitation, the protective conductive coating may be formed on the inner metal surfaces of the plasma etch chamber by maintaining the chamber at a temperature of from about 20° C. (i.e., about ambient temperature) to about 500° C.

Reactant gases, including a source of the conductive coating material, may then be flowed into the chamber at a rate of from about 10 standard cubic centimeters/second (sccm) to about 1000 sccm, while maintaining a pressure in the chamber ranging from about 1 milliTorr to about 500 milliTorr. While it is possible to use higher pressures during the plasma-assisted CVD formation of the conductive coating layer, the use of such higher pressures is not preferred due to the resulting constricting of the plasma. Use of pressures within the recited range will result in a more diffuse plasma of uniform intensity throughout the chamber resulting in a more uniform deposition of the protective coating on the inner surfaces of the etch chamber.

In a preferred embodiment, the reactant gases comprises a mixture of the gaseous source of the protective coating and either hydrogen or nitrogen gas in a range of from about 60/40 to about 40/60 volume percent, and most preferably about a 50/50 volume percent mixture.

When the flow of reactant gases into the chamber commences, a plasma is ignited and maintained at a power level ranging from about 200 watts to about 1000 watts during the deposition, using a RF power source operating at a frequency of, for example, from about 100 KHz to about 100 MHz or a microwave source, i.e., an electromagnetic radiation source at a frequency of from about $10^9$ to about $10^{11}$ Hertz (1-100 gigaHertz).

The deposition is carried out for a period of time sufficient to deposit at least the minimum coating thickness of 0.2 micrometers on the inner walls of the metal plasma etch chamber. The exact time necessary to achieve such a minimum coating thickness may be empirically determined for the particular CVD conditions employed during the deposition process, it being recognized that chamber geometries will differ from chamber to chamber which will, in turn, affect the deposition rate for any given set of CVD reaction parameters.

FIG. 2 illustrates a parallel plate reactive ion etching mode, plasma etching apparatus 50, which also includes a substantially closed metal reaction chamber 52 comprising a top plate 54, sidewalls 56 and a baseplate 58, with a connection 60 to a vacuum pump (not shown) for partially evacuating the interior of the chamber, a gas supply 62 for communicating the reactant gas to the chamber through a valve-controlled conduit arrangement 64, an RF power supply 66 which supplies RF energy to a cathode structure 68 and baseplate 58 which serves as the grounded anode.

In contrast to plasma etching apparatus 20 illustrated in FIG. 1, in plasma etching apparatus 50, wafers 10 are mounted on cathode 68, which is shielded from and separated from grounded anode baseplate 58. In accordance with the invention, a protective conductive coating 72 is shown formed on the inner surfaces of the metal chamber in a manner generally similar to that described above.

FIG. 3 illustrates another reactive ion etching mode, plasma etching apparatus 80, which, like plasma etching apparatus 20 and 50, is available commercially from Applied Materials, Inc. of Sata Clara, Cal. Plasma etching apparatus 80 includes a cylindrical metal reaction chamber 82 comprising a top portion 84, sidewalls 86 and a baseplate 88, with a connection 90 to a vacuum pump (not shown) for partially evacuating the interior of the chamber. Gas supply 92 is connected to chamber 82 to supply reactant gas to the chamber through valve and conduit arrangement 94 to a gas distribution ring 104 at the top of the chamber. A hexagonal cathode 98 is connected to an RF power supply 96. The walls of plasma etch chamber 82, including sidewalls 86, top portion 84 and baseplate 88 form the grounded anode of the apparatus. As in the previously described plasma etch chambers, in accordance with the invention, a protective conductive coating 102 is formed on the inner surfaces of metal chamber 82 in a manner generally similar to that previously described.

The parallel plate plasma etching apparatus 20 shown in FIG. 1 is a relatively high pressure system, operating in the pressure range of from about 100 milliTorr to about several Torr, and thus involves a substantially flow rate of reactant gases into the apparatus. In contrast, the reactive ion etching apparatus 50 and 80 are operated at low pressures in the range of from about 1 to about 100 milliTorr and, thus, use substantially lower gas flow rates during normal plasma etching.

Therefore, while conductive coatings 72 and 102 are stated above to be generally formed in substantially similar manner to the deposition conditions described for the formation of protective coating 42 in chamber 22, it will be recognized that flow rates and pressures at the low end of the respective ranges noted above will be employed when depositing the protective conductive coating of the invention on the inner surfaces of metal chambers such as shown in FIGS. 2 and 3.

By way of illustration of the invention, a protective conductive coating of carbon may be deposited on the inner metal surfaces of a plasma etching chamber similar to that described and shown in FIG. 1-3 above. The chamber may be maintained at a temperature of about 30° C., while a 50/50 volume percent mixture of $CH_4$ gas and $H_2$ gas is flowed into the chamber at a rate of 100 sccm while the chamber is evacuated through a vacuum pump to maintain the pressure in the chamber at about 60 milliTorr. A plasma powered by an RF energy source can be ignited in the chamber and maintained at a power level of 400 watts during the deposition. After about 20 minutes, the plasma may be extinguished and the gas flow stopped.

After completion of the deposition, the inner metal chamber surfaces will be found to have deposited thereon an adherent layer of carbon sufficiently thick all over to provide the desired chemical protection of the metal surfaces from attack by the reactant gases employed during subsequent plasma etching processes without, however, interfering with the electrical characteristics of the plasma etching chamber.

Thus, the invention provides an improved plasma etching apparatus having a conductive coating applied to the inner metal surfaces to protect the metal from chemical attack by the reactant gases employed in plasma etching processes carried out within the etch chamber as well as a method for forming the coated chamber.

Having thus described the invention, what is claimed is:

1. A process for forming a conductive coating of carbon on the inner metal surfaces of a metal etch chamber of a plasma etching apparatus to protect the inner metal surfaces of said etch chamber from chemical attack by reactant gases used in said chamber during said plasma etching which comprises:
   a) maintaining said chamber at a temperature within the range of from about 20° C. to about 500° C.;
   b) maintaining said chamber within a pressure range of from about 1 milliTorr to about 500 milliTorr;
   c) flowing into said chamber, at a rate of from 10 sccm to about 1000 sccm, a gaseous mixture capable of forming said conductive coating of carbon on said inner metal surfaces of said chamber, said gaseous mixture comprising:
      i) from about 40 to about 60 volume percent of one or more gases capable of forming said conductive coating of carbon; and
      ii) from about 40 to about 60 volume percent of a second gas selected from the class consisting of hydrogen, nitrogen, and a mixture of said gases;
   d) maintaining a plasma in said chamber, during said flow of said gaseous mixture, at a power level within a range of from about 200 to about 1000 watts; and
   e) maintaining said flow of said gaseous mixture into said chamber and maintaining said plasma in said chamber until at least about 0.2 micrometers of said conductive coating of carbon is formed on said inner metal surfaces of said chamber.

2. The process of claim 1 wherein said one or more gases capable of forming said conductive carbon coating are selected from the class consisting of one or more gases containing carbon and hydrogen; one or more gases containing carbon and nitrogen; one or more gases containing carbon, hydrogen, and nitrogen; and mixtures thereof.

3. A process for forming a conductive carbon-based coating on the inner metal surfaces of a metal etch chamber of a plasma etching apparatus to protect the inner metal surfaces of said etch chamber from chemical attack by reactant gases used in said chamber during said plasma etching which comprises:
   a) maintaining said chamber at a temperature within the range of from about 20° C. to about 500° C. to form a conductive carbon-based coating;
   b) maintaining said chamber within a pressure range of from about 1 milliTorr to about 500 milliTorr;
   c) flowing into said chamber, at a rate of from 10 sccm to about 1000 sccm, a gaseous mixture, including a carbon-containing gas, capable of forming said conductive carbon-based coating on said inner metal surfaces of said chamber;

d) maintaining a plasma in said chamber, during said flow of said gaseous mixture, at a power level within a range of from about 200 to about 1000 watts and e) maintaining said flow of said gaseous mixture into said chamber and maintaining said plasma in said chamber until at least about 0.2 micrometers of said conductive carbon-based coating is formed on said inner metal surfaces of said chamber.

4. A process for forming a conductive metal compound coating selected from the group consisting of titanium nitride, indium stannate, silicon carbide, titanium carbide, and tantalum carbide on the inner metal surfaces of a metal etch chamber of a plasma etching apparatus, suitable for use in the processing semiconductor wafers, to protect the inner metal surfaces of said etch chamber from chemical attack by reactant gases used in said chamber during said plasma etching which comprises:

a) maintaining said chamber at a temperature within the range of from about 20° C. to about 500° C.;

b) maintaining said chamber within a pressure range of from about 1 milliTorr to about 500 milliTorr;

c) flowing into said chamber, at a rate of from 10 sccm to about 1000 sccm a gaseous mixture capable of forming said conductive metal compound;

d) maintaining a plasma in said chamber, during said flow of said gaseous mixture, at a power level within a range of from about 200 to about 1000 watts; and e) maintaining said flow of said gaseous mixture into said chamber and maintaining said plasma in said chamber until at least about 0.2 micrometers of said conductive metal compound coating is formed on said inner metal surfaces of said chamber.

* * * * *